(12) United States Patent
Wang et al.

(10) Patent No.: US 12,500,590 B2
(45) Date of Patent: Dec. 16, 2025

(54) PHASE-LOCKED LOOP CIRCUIT

(71) Applicant: MediaTek Singapore Pte. Ltd., Singapore (SG)

(72) Inventors: Ming Wang, Anhui (CN); Kun Lan, Anhui (CN); Cong Liu, Anhui (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 13 days.

(21) Appl. No.: 18/638,878

(22) Filed: Apr. 18, 2024

(65) Prior Publication Data
US 2025/0300662 A1 Sep. 25, 2025

(30) Foreign Application Priority Data

Mar. 25, 2024 (CN) .......................... 202410348818.6

(51) Int. Cl.
H03L 7/08 (2006.01)
H03L 7/093 (2006.01)

(52) U.S. Cl.
CPC ................ H03L 7/08 (2013.01); H03L 7/093 (2013.01)

(58) Field of Classification Search
None
See application file for complete search history.

(56) References Cited

U.S. PATENT DOCUMENTS

| 5,382,922 A * | 1/1995 | Gersbach | H03L 7/099 331/25 |
| 6,014,177 A * | 1/2000 | Nozawa | H04N 5/126 348/544 |
| 6,160,861 A * | 12/2000 | McCollough | H03C 3/095 375/376 |
| 6,188,289 B1 * | 2/2001 | Hyeon | H03L 7/099 331/25 |
| 6,856,204 B2 * | 2/2005 | Kwon | H03L 7/0891 331/34 |
| 7,719,365 B2 * | 5/2010 | Sahu | H03L 7/093 327/344 |

(Continued)

OTHER PUBLICATIONS

Extended European Search Report dated May 9, 2025, issued in application No. EP 24214599.3.

Primary Examiner — Thomas J. Hiltunen
(74) Attorney, Agent, or Firm — McClure, Qualey & Rodack, LLP

(57) ABSTRACT

A PLL circuit generates an output signal having an output frequency and includes a voltage-to-current conversion circuit, a frequency compensation circuit, and an ICO. The voltage-to-current conversion circuit is configured to generate a first control current according to a control voltage, wherein the control voltage is generated according to a reference signal and a feedback signal derived from the output signal. The frequency compensation circuit is configured to generate a second control current according to the control voltage. The ICO generates the output signal according to an oscillation current, wherein the oscillation current is a sum of the first control current and the second control current. In response to the frequency compensation circuit detecting that the control voltage is out of a predetermined range, the second control current is controlled to be negatively correlated with the output frequency.

19 Claims, 7 Drawing Sheets

(56) References Cited

U.S. PATENT DOCUMENTS

| | | | |
|---|---|---|---|
| 7,876,163 B2 * | 1/2011 | Hachigo | H03L 7/099 331/34 |
| 8,432,204 B1 | 4/2013 | Chern | |
| 8,638,173 B2 * | 1/2014 | Murphy | H03L 7/0891 331/182 |
| 2002/0079973 A1 * | 6/2002 | Higashi | H03L 1/022 331/16 |
| 2003/0222722 A1 | 12/2003 | Kwon | |
| 2006/0284687 A1 | 12/2006 | Abel | |

* cited by examiner

PHASE-LOCKED LOOP CIRCUIT

CROSS REFERENCE TO RELATED APPLICATIONS

This application claims priority of China Patent Application No. 202410348818.6, filed on Mar. 25, 2024, the entirety of which is incorporated by reference herein.

BACKGROUND OF THE INVENTION

Field of the Invention

The disclosure relates to a phase-locked loop circuit, and more particularly to a phase-locked loop circuit with frequency compensation.

Description of the Related Art

A phase-locked loop (PLL) is a frequency and phase control system that operates based on a feedback control principle, thereby synchronizing an output signal of the PLL with an external reference signal input to the PLL. When there is a difference in the frequency or phase between the output signal and the external reference signal, the PLL adjusts the frequency of the output signal until the output signal and the external reference signal are resynchronized. After the PLL is locked, the PLL may be unlocked due to a PVT variation. Thus, it is an important issue to prevent the PLL from being affected by the PVT variation.

BRIEF SUMMARY OF THE INVENTION

An exemplary embodiment provides a phase-locked loop (PLL) circuit. The PLL circuit generates an output signal having an output frequency. The PLL circuit comprises a voltage-to-current conversion circuit, a frequency compensation circuit, and a current-controlled oscillator (ICO). The voltage-to-current conversion circuit is configured to generate a first control current according to a control voltage, wherein the control voltage is generated according to a reference signal and a feedback signal derived from the output signal. The frequency compensation circuit is configured to generate a second control current according to the control voltage. The ICO is configured to generate the output signal according to an oscillation current, wherein the oscillation current is a sum of the first control current and the second control current. In response to the frequency compensation circuit detecting that the control voltage is out of a predetermined range, the second control current is controlled to be negatively correlated with the output frequency.

According to the above embodiment, when the control voltage is out of the predetermined range due to the shifting of the frequency of the output signal which may be caused by a PVT variation, the frequency compensation circuit adjusts the control current $I_{BAND}$, thereby compensating the frequency shifting to stabilize the output signal at the desired target frequency.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Figure 1:
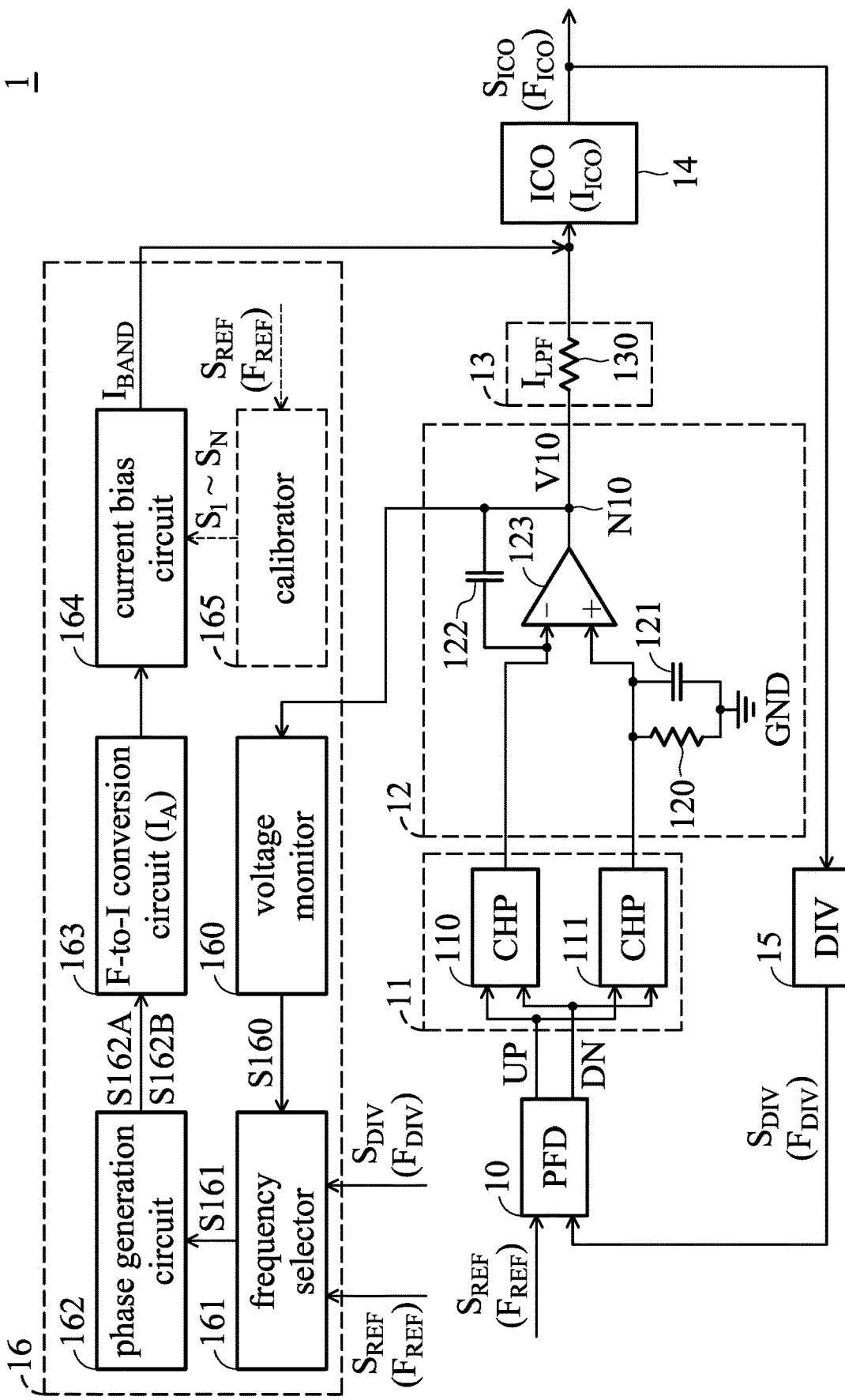
FIG. 1 shows an exemplary embodiment of a phase-locked loop (PLL) circuit.

The following description is of the best-contemplated mode of carrying out the disclosure. This description is made for the purpose of illustrating the general principles of the disclosure and should not be taken in a limiting sense. The scope of the disclosure is best determined by reference to the appended claims.

The disclosure provides a PLL comprising a frequency compensation circuit and a current-controlled oscillator (ICO). This configuration enhances the stability of the PLL's output signal and maintains synchronization of the PLL's output signal with the reference signal, ensuring that the output signal is maintained at a desired target frequency that can be matched with the reference signal. It should be noted that the focus of this disclosure is on the frequency compensation circuit for the purpose of stabilizing the frequency of the output signal at the desired target frequency, and the other structures in the PLL should be not limited to the specific exemplary embodiments shown in the drawings. In the embodiment, a voltage-to-current (V-to-I) conversion circuit is configured to generate a first control current ($I_{LPF}$) according to a control voltage, wherein the control voltage is generated according to the output signal and a reference signal, for instance, the control voltage is related to the frequency and phase differences between the reference signal and the output signal (including a derivative signal thereof, such as a feedback signal $S_{DIV}$ shown in FIG. 1). It is noted that the generation of the control voltage is well-known to those skilled in the art, hence the present disclosure does not limit the methods of generating the control voltage. In general, ICO is also often referred to as Voltage-Controlled Oscillator (VCO), for which the disclosure is not limited. The frequency compensation circuit is configured to generate a second control current ($I_{BAND}$) according to the control voltage, and the ICO is configured to generate the output signal according to an oscillation current which is a sum of the first control current and the second control current. In the embodiment, in response to the frequency compensation circuit detecting that the control voltage is out of a predetermined range (VL~VH), the frequency compensation circuit adjusts the second control current, such that the second control current is negatively correlated with the output frequency of the output signal. However, if the frequency compensation circuit detecting that the control voltage is within the predetermined range (VL~VH), the second control current is related to the frequency of the reference signal.

FIG. 1 shows an exemplary embodiment of a phase-locked loop (PLL) circuit. As shown in FIG. 1, a PLL circuit 1 comprises a phase frequency detector (PFD) 10, a charge pump circuit 11, a low pass filter (LPF, also referred to a loop filter in the PLL) 12, a voltage-to-current (V-to-I) conversion circuit 13, a current-controlled oscillator (ICO) 14, a frequency divider (DIV) 15, and a frequency compensation circuit 16. The PPL circuit 1 receives a reference signal $S_{REF}$ having a reference frequency FREF and generates an output signal $S_{ICO}$. The PPL circuit 1 further locks the output frequency $F_{ICO}$ of the output signal $S_{ICO}$ according to the reference signal $S_{REF}$ and a feedback signal $S_{DIV}$, wherein the feedback signal $S_{DIV}$ is obtained by performing a frequency division operation on the output signal $S_{ICO}$.

The frequency divider (DIV) 15 receives the output signal $S_{ICO}$ and performs the frequency division operation on the output signal $S_{ICO}$. Specifically, the frequency divider 15 divides the output signal $S_{ICO}$ by X to generate the feedback signal $S_{DIV}$, for example, X≥1. Thus, the frequency $F_{DIV}$ of the feedback signal $S_{DIV}$ is equal to 1/X of the output frequency $F_{ICO}$ of the output signal $S_{ICO}$. The PFD 10 receives the reference signal $S_{REF}$ and the feedback signal $S_{DIV}$, and the PFD 10 is configured to detect the difference in the frequency and phase between the reference signal $S_{REF}$ and the feedback signal $S_{DIV}$ to generate detection signals UP and DN, wherein the detection signals UP and DN are used for indicating the frequency and phase difference between the reference signal $S_{REF}$ and the feedback signal $S_{DIV}$. For example, the detection signals UP and DN are digital signals.

In the embodiment of FIG. 1, the LPF 12 is implemented by a dual-path LPF. Thus, the charge pump circuit 11 comprises two charge pumps (CHPs) 110 and 111, however, the disclosure is not limited to this example. Each of the charge pumps 110 and 111 receives the detection signals UP and DN. Each of the charge pumps 110 and 111 charges or discharge the LPF 12 according to the detection signals UP and DN. According to the embodiment, the LPF 12 comprises a resistor 120, capacitors 121 and 122, and an operational amplifier 123. The operational amplifier 123 has a positive input terminal (+), a negative input terminal (−), and an output terminal coupled to a node N10. Each of the resistor 120 and the capacitor 121 is coupled between the positive input terminal of the operational amplifier 123 and a ground GND. The capacitor 122 is coupled between the negative input terminal and the output terminal of the operational amplifier 123. A control voltage V10 is generated by the LPF 12 at the node N10. During a normal operation of the PLL circuit 1 being a locked state, the control voltage V10 varies in a predetermined range.

In one example shown by FIG. 1, the V-to-I conversion circuit 13 comprises a resistor 130 and a control current $I_{LPF}$ is generated, wherein the control current $I_{LPF}$ is related to the control voltage V10 and the resistive value R130 of the resistor 130. Specifically, the control current $I_{LPF}$ is related to a cross-voltage between the output of the LPF 12 and the input of the ICO 14. The frequency compensation circuit 16 is coupled to the node N10 to receive the control voltage V10 and is configured to generate a control current $I_{BAND}$ according to the control voltage V10. In response to the control voltage V10 is out of or deviates from the predetermined range, the control current $I_{BAND}$ is regulated to exhibit a negative correlation with the output frequency $F_{ICO}$ of the output signal $S_{ICO}$. For example, an increase in the output frequency $F_{ICO}$ of the output signal $S_{ICO}$ induces a decrease in the control current $I_{BAND}$, whereas a decrease in the output frequency $F_{ICO}$ of the output signal $S_{ICO}$ induces an increase in the control current $I_{BAND}$. However, when the control voltage V10 is within the predetermined range, the control current $I_{BAND}$ is maintained at a predetermined value or an updated value which corresponds to the desired target frequency. The ICO 14 receives an oscillation current $I_{ICO}$, for example, the oscillation current $I_{ICO}$ is the sum of the control currents $I_{LPF}$ and $I_{BAND}$ ($I_{ICO}=I_{LPF}+I_{BAND}$), and the ICO 14 is configured to generate the output signal $S_{ICO}$ according to the oscillation current $I_{ICO}$. It is understandable that the oscillation current $I_{ICO}$ is related to the control voltage V10.

After the PLL circuit 1 is locked, the control current $I_{LPF}$ is determined by the difference between the oscillation current $I_{ICO}$ and the control current $I_{BAND}$, that is $I_{LPF}=I_{ICO}-I_{BAND}$. Due to variations in environment or operation parameters of the PLL circuit 1 (for example, a PVT variation), the control current $I_{BAND}$ or the oscillation current $I_{ICO}$ may change, which induces a change in the control current $I_{LPF}$. When the change in the control current $I_{LPF}$ is great, the control voltage V10 may be out of the predetermined range so that the LPF 12 cannot operate normally. Consequently, the PLL circuit 1 transitions to an unlocked state or is no longer maintained in the locked state, and the output frequency $F_{ICO}$ of the output signal $S_{ICO}$ will shift or deviate away from the desired target frequency. According to the embodiment, the frequency compensation circuit 16 operates based on the control voltage V10 to adjust the control current $I_{BAND}$, thereby compensating the frequency shifting.

The frequency compensation circuit 16 comprises a voltage monitor 160, a frequency selector 161, a phase generation circuit 162, a frequency-to-current (F-to-I) conversion circuit 163, and a current bias circuit 164. The voltage monitor 160 is coupled to the node N10 to receive the control voltage V10. The voltage monitor 160 defines the predetermined range for the control voltage V10 and the voltage monitor 160 is configured to generate a selection signal S160 for indicating whether the control voltage V10 is out of the predetermined range. The frequency selector 161 receives the reference signal $S_{REF}$ and the feedback signal $S_{DIV}$, and the frequency selector 161 is configured to select one of the reference signal $S_{REF}$ and the feedback signal $S_{DIV}$ according to the selection signal 160 to serve as a control signal S161. The phase generation circuit 162 receives the control signal S161 and is configured to generate switching signals S162A and S162B according to the control signal S161. In the embodiment, the switching signals S162A and S162B are signals with equal frequency and opposite phase. That is, the switching signals S162A and S162B are phase-inverted. The switching frequency $F_{162}$ of the switching signals S162 and S162B is equal to the frequency of the control signal S161, that is, the switching frequency of the switching signals S162 and S162B is equal to the reference frequency FREF of the reference signal $S_{REF}$ or the frequency $F_{DIV}$ of the feedback signal $S_{DIV}$, which depends on the selection signal 160. The F-to-I conversion circuit 163 receives the switching signals S162 and S162B, and is configured to generate a bias current $I_A$ according to the switching frequency $F_{162}$ of the switching signals S162 and S162B. The current bias circuit 164 is coupled to the F-to-I conversion circuit 163 and is configured to generate the control current $I_{BAND}$ based on the bias current $I_A$ through a negative feedback operation. When the control voltage V10 is out of the predetermined range, the frequency compensation circuit 16 operates based on the feedback signal $S_{DIV}$ to adjust the control current $I_{BAND}$.

Based on the adjustment of the control current $I_{BAND}$, the oscillation current $I_{ICO}$ changes, and the output frequency $F_{ICO}$ changes so that the control voltage V10 will be changed. The above operation will be repeated until the control voltage V10 returns back into the predetermined range through the operations of the PLL circuit 1.

Figure 2:
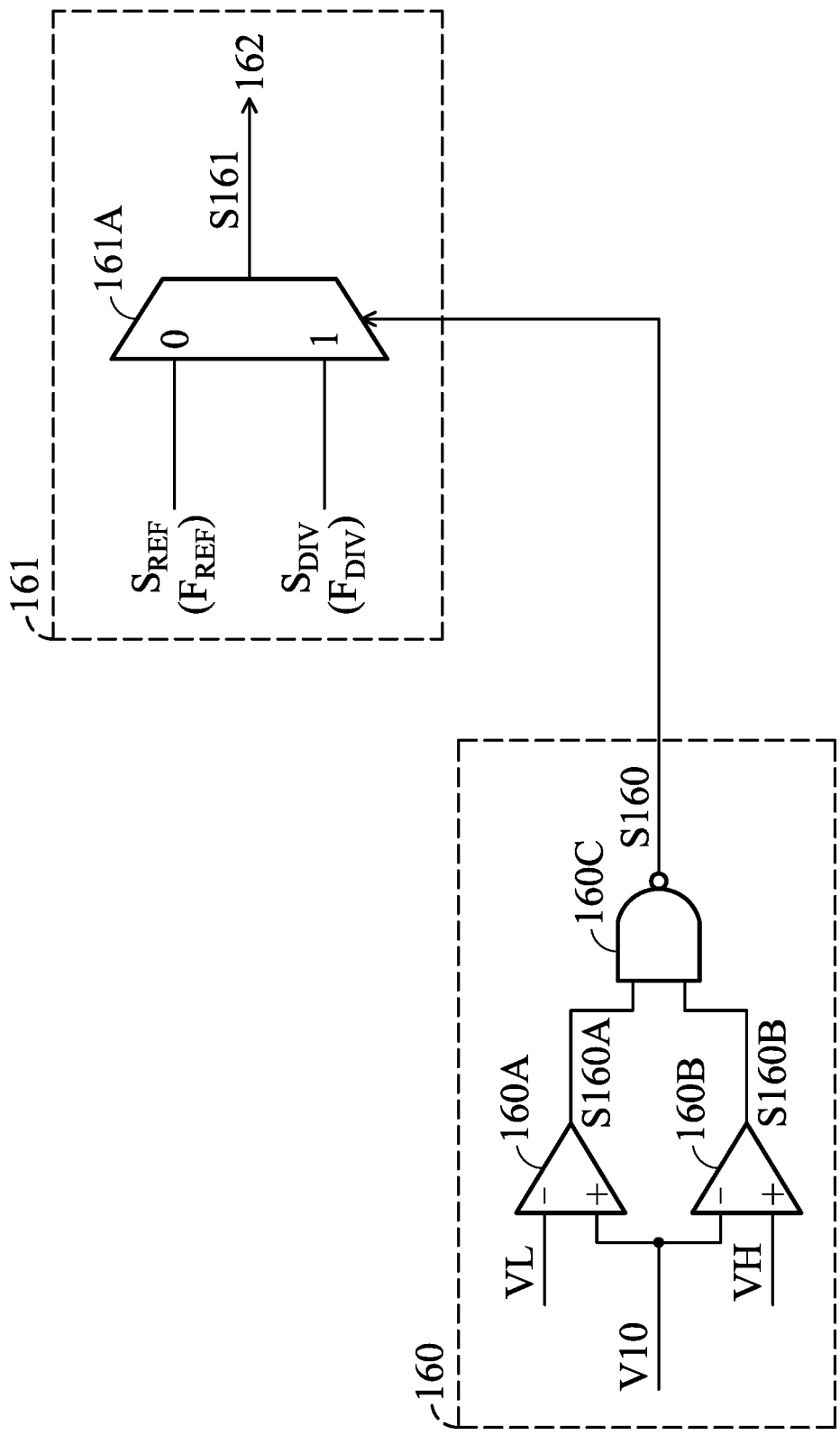
FIG. 2 shows an exemplary embodiment of a voltage monitor and a frequency selector of the PPL circuit shown in FIG. 1.

FIG. 2 shows an exemplary embodiment of the voltage monitor 160 and the frequency selector 161. As shown in FIG. 2, the voltage monitor 160 comprises comparators 160A and 160B and a NAND gate 160C. In a preferred embodiment, the comparators 160A and 160B are hysteresis comparators respectively. A positive input terminal (+) of the comparator 160A receives the control voltage V10, a negative input terminal (−) thereof receives a lower voltage threshold VL, and an output terminal thereof generates a comparison signal S160A. A positive input terminal (+) of the comparator 160B receives an upper voltage threshold VH, a negative input terminal (−) thereof receives the control voltage V10, and an output terminal thereof generates a comparison signal S160B. The NAND gate 160C receives the comparison signals S160A and S160B and generates the selection signal S160. The upper voltage threshold VH is greater than the lower voltage threshold VL, and the predetermined range is defined by the upper voltage threshold VH and the lower voltage threshold VL.

The frequency selector 161 comprises a multiplexer (MUX) 161A. A first input terminal (0) of the multiplexer 161A receives the reference signal $S_{REF}$, a second input terminal (1) thereof receives the feedback signal $S_{DIV}$, and an output terminal thereof outputs the control signal S161. The multiplexer 161A receives the selection signal S160 and is configured to select the reference signal $S_{REF}$ or the feedback signal $S_{DIV}$ according to the selection signal S160. When the selection signal S160 is asserted (for example, a high voltage level), the multiplexer 161A selects the feedback signal $S_{DIV}$ and transmits the feedback signal $S_{DIV}$ to the output terminal of the multiplexer 161A to serve as the control signal S161 so that the frequency of the control signal S161 is equal to the frequency $F_{DIV}$ of the feedback signal $S_{DIV}$. When the selection signal S160 is de-asserted, the multiplexer 161A selects the reference signal $S_{REF}$ and transmits the reference signal $S_{REF}$ to the output terminal of the multiplexer 161A to serve as the control signal S161 so that the frequency of the control signal S161 is equal to the reference frequency FREF of the reference signal $S_{REF}$.

Figure 3:
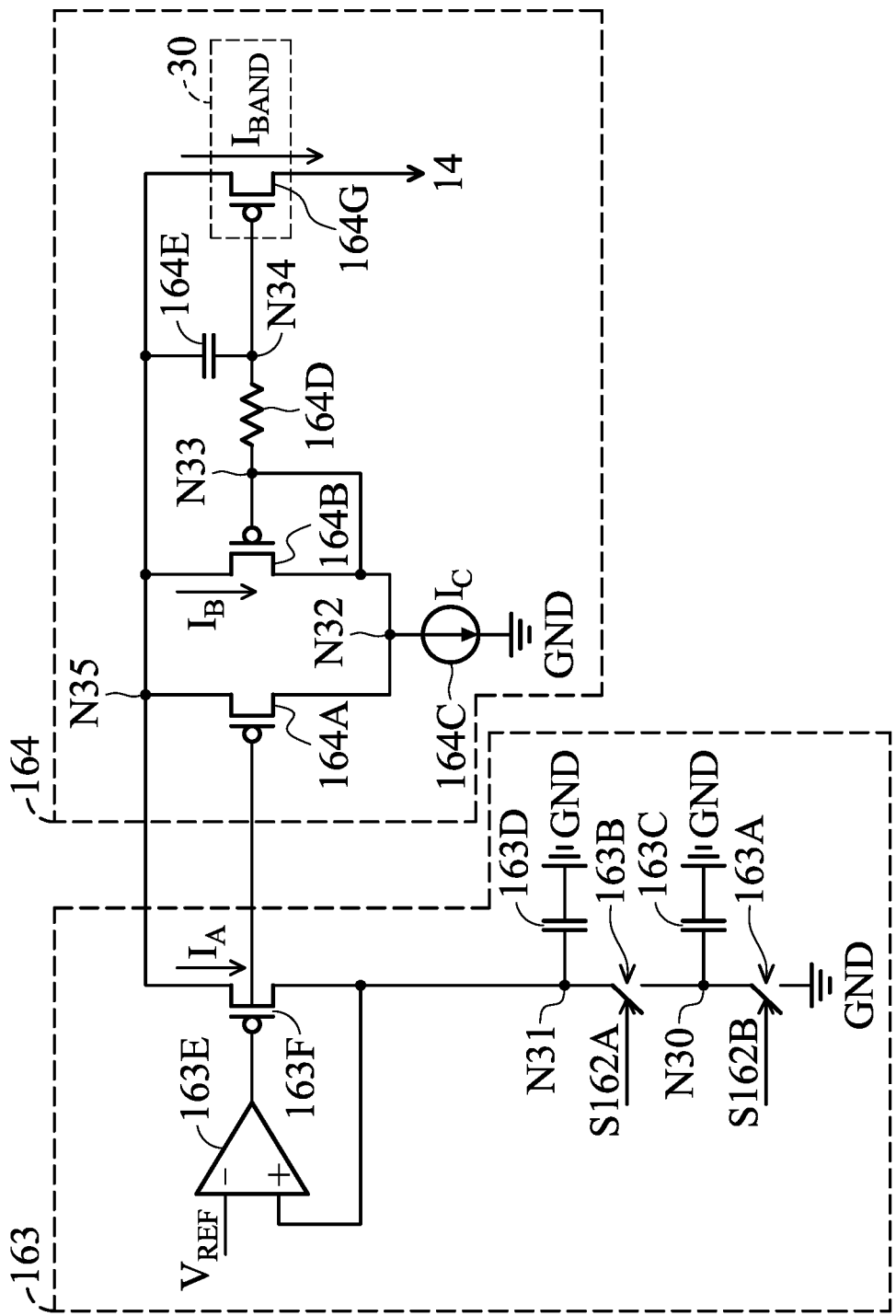
FIG. 3 shows one exemplary embodiment of a frequency-to-current conversion circuit and a current bias circuit of the PPL circuit shown in FIG. 1.

FIG. 3 shows one exemplary embodiment of the F-to-I conversion circuit 163 and the current bias circuit 164. Referring to FIG. 3, the F-to-I conversion circuit 163 comprises switches 163A and 163B, capacitors 163C and 163D, an operational amplifier 163E, and a P-type transistor 163F. It should be noted that the capacitor 163D is optional, and the inclusion of capacitor 163D serves to attenuate the ripple present on the current $I_A$, thereby enhancing the stability of the current $I_A$. In the embodiment, the P-type transistor 163F is implemented by a P-type metal-oxide-semiconductor (PMOS) transistor. The switch 163A is coupled between a node N30 and a ground GND and controlled by the switching signal S162B. The capacitor 163C is coupled between the node N30 and the ground GND. The switch 163B is coupled between a node N31 and the node N30 and controlled by the switching signal S162. The capacitor 163D is coupled between the node N31 and the ground GND. The source of the PMOS transistor 163F is coupled to a node N35, and the drain thereof is coupled to the node N31. A positive input terminal (+) of the operational amplifier 163E is coupled to the node N31, a negative input terminal (−) thereof receives a reference voltage $V_{REF}$, and an output terminal thereof is coupled to the gate of the PMOS transistor 163F. In the embodiment, the capacitive value of the capacitor 163D is greater than the capacitive value $C_{163C}$ of the capacitor 163C.

As shown in FIG. 3, the bias current $I_A$ flows through the P-type transistor 163F. The bias current $I_A$ is determined by the reference voltage $V_{REF}$, the frequency $F_{162}$ of the switching signals S162A and S162B (or the control signal S161), and the capacitive value ($C_{163C}$) of the capacitor 163C. In the embodiment, the bias current $I_A$ is positively correlated with the frequency $F_{162}$. For example, in one example implementation, the bias current $I_A$ is equal to the product of the reference voltage $V_{REF}$, the frequency $F_{162}$, and the capacitive value $C_{163C}$ ($I_A = V_{REF} * F_{162} * C_{163C}$).

Referring to FIG. 3, the current bias circuit 164 comprises P-type transistors 164A and 164B, a current source 164C, a resistor 164D, a capacitor 164E, and a current generation circuit 30. In the embodiment, the P-type transistors 164A and 164B are implemented by PMOS transistors. The gate of the P-type transistor 164A is coupled to the output terminal of the operational amplifier 163E (also coupled to the gate of the P-type transistor 163F), a source thereof is coupled to the node N35, a drain thereof is coupled to a node N32. The current source 164C is coupled between the node N32 and the ground GND and provides a predetermined current $I_C$. The gate of the PMOS transistor 164B is coupled to a node N33, a source thereof is coupled to the node N35, a drain thereof is coupled to the node N32. A first terminal of the resistor 164D is coupled to the node N33, and a second terminal thereof is coupled to a node N34. A first terminal of the capacitor 164E is coupled to the node N35, and a second terminal thereof is coupled to the node N34.

In the embodiment of FIG. 3, the current generation circuit 30 is coupled to the node N35 and the ICO 14. The current generation circuit 30 comprises a single band current. Referring to FIG. 3, the current generation circuit 30 comprises a P-type transistor 164G. In the embodiment, the P-type transistor 164G is implemented by a PMOS transistor. The gate of the transistor 164G is coupled to the node N34, a source coupled to the node N35, and a drain coupled to the ICO 14.

Referring to FIG. 3, the negative feedback operation is performed by the P-type transistors 164A and 164B and the current source 164C. Based on the negative feedback operation, a bias current $I_B$ is generated according to the bias current $I_A$ and the predetermined current $I_C$, wherein the bias current $I_B$ is negatively correlated with the bias current $I_A$. For example, in one example implementation, $I_B = I_C - I_A$. The bias current $I_B$ flows through the PMOS transistor 164B. The resistor 164D and the capacitor 164E form a low pass filter to filter out the noise in the bias current $I_B$, and it is noted that the resistor 164D and the capacitor 164E are optional. The current generation circuit 30 generates the control current $I_{BAND}$ according to the bias current $I_B$. The control current $I_{BAND}$ flows through the PMOS transistor 164G. In the embodiment of FIG. 3, the control current $I_{BAND}$ is positively correlated with the bias current $I_B$. For instance, the ratio between the control current $I_{BAND}$ and the bias current $I_B$ may be changed by altering the channel size ratio of the P-type transistors 164G and 164B, and the control current $I_{BAND}$ may be equal to the bias current $I_B$.

Referring to FIGS. 1-3, when the output frequency $F_{ICO}$ of the output signal $S_{ICO}$ increases due to a PVT variation after the PLL circuit 1 is locked, the control voltage V10 increases. In the case where the control voltage V10 is higher than the upper voltage threshold VH, the voltage monitor 160 may generate the selection signal S160 with a high voltage level, the multiplexer 161A of the frequency selector 161 selects the feedback signal $S_{DIV}$ to serve as the control signal S161, and the phase generation circuit 162 generates the switching signals S162A and S162B having the frequency $F_{DIV}$ which is related to the output frequency $F_{ICO}$ according to the control signal S161. Since the feedback signal $S_{DIV}$ is derived from the output signal $S_{ICO}$, the frequency $F_{162}$ of the switching signals S162A and S162B increases with the increment of the frequency of the feedback signal $S_{DIV}$. Because the bias current $I_A$ is positively correlated with the frequency $F_{162}$ (for example, $I_A = V_{REF} * F_{162} * C_{163C}$), the bias current $I_A$ increases in response to the increase in the frequency $F_{162}$ of the switching signals S162A and S162B. Based on the negative feedback operation performed by the PMOS transistors 164A and 164B and the current source 164C, the bias current $I_B$ decreases in response to the increment of the bias current $I_A$. The control current $I_{BAND}$ decreases with the decrement of the bias current $I_B$. Due to the decrement of the control current $I_{BAND}$, the oscillation current $I_{ICO}$ decreases, and the output frequency $F_{ICO}$ of the output signal $S_{ICO}$ decreases. In response to the decrement of the output frequency $F_{ICO}$, the control voltage V10 decreases. Then, the above operation will be repeated until the control voltage V10 returns back into the predetermined range. Thus, the LPF 12 can operate normally and the PLL circuit 1 enters into the locked state again and the output signal is maintained at the desired target frequency.

When the output frequency $F_{ICO}$ of the output signal $S_{ICO}$ decreases due to a PVT variation after the PLL circuit 1 is locked, the control voltage V10 decreases. In the case where the control voltage V10 is lower than the lower voltage threshold VH, the voltage monitor 160 may generate the selection signal S160 with the high voltage level, the multiplexer 161A of the frequency selector 161 selects the feedback signal $S_{DIV}$ to serve as the control signal S161, and the phase generation circuit 162 generates the switching signals S162A and S162B having the frequency $F_{DIV}$ according to the control signal S161. Since the feedback signal $S_{DIV}$ is derived from the output signal $S_{ICO}$, the frequency $F_{162}$ of the switching signals S162A and S162B decreases with the decrement of the frequency of the feedback signal $S_{DIV}$ or the output frequency $F_{ICO}$. Similarly, Because the bias current $I_A$ is positively correlated with the frequency $F_{162}$ (for example, $I_A = V_{REF} * F_{162} * C_{163C}$), the bias current $I_A$ decreases in response to the decrease or reduction in the frequency $F_{162}$ of the switching signals S162A and S162B. Based on the negative feedback operation performed by the PMOS transistors 164A and 164B and the current source 164C, the bias current $I_B$ increases in response to the decrement of the bias current $I_A$. The control current $I_{BAND}$ increases with the increment of the bias current $I_B$. Due to the increment of the control current $I_{BAND}$, the oscillation current $I_{ICO}$ increases, and the output frequency $F_{ICO}$ of the output signal $S_{ICO}$ increases. In response to the increment of the output frequency $F_{ICO}$, the control voltage V10 increases. Then, the above operation will be repeated until the control voltage V10 returns back into the predetermined range. Thus, the LPF 12 can operate normally and the PLL circuit 1 enters into the locked state again and the output signal is maintained at the desired target frequency.

Figure 4:
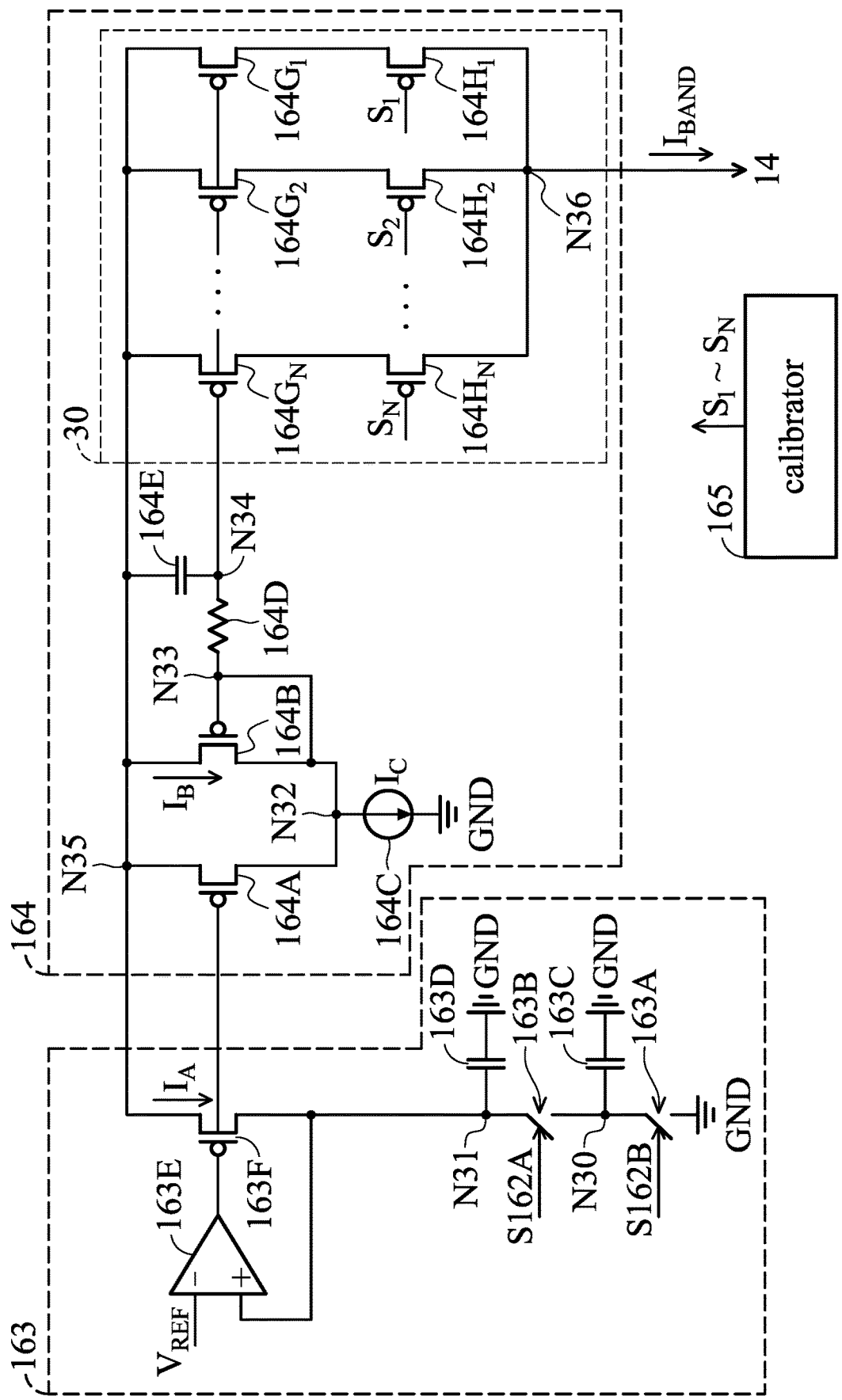
FIG. 4 shows another exemplary embodiment of a frequency-to-current conversion circuit and a current bias circuit of the PPL circuit shown in FIG. 1.

In the embodiment of FIG. 3, the current generation circuit 30 comprises or generates a single-band current. In other embodiments, the current generation circuit 30 may comprise or generate multi-band currents. For example, as shown in FIG. 4, the current generation circuit 30 comprises P-type transistors $164G_1$-$164G_N$ and $164H_1$-$164H_N$ to form multiple band currents. In the embodiment, the P-type transistors within the current generation circuit 30 are implemented by PMOS transistors. The PMOS transistors $164G_1$ and $164H_1$ can form a first band current. The gate of the transistor $164G_1$ is coupled to the node N34, and the source thereof is coupled to the node N35. The gate of the transistor $164H_1$ receives a bit signal $S_1$, the source thereof is coupled to the drain of the PMOS transistor $164G_1$, and the drain there of is coupled to a node N36. The PMOS transistors $164G_2$ and $164H_2$ can form a second band current. The gate of the transistor $164G_2$ is coupled to the node N34, and the source thereof is coupled to the node N35. The gate of the transistor $164H_2$ receives a bit signal S2, the source thereof is coupled to the drain of the PMOS transistor $164G_2$, and the drain there of is coupled to the node N36. The PMOS transistors $164G_N$ and $164H_N$ can form a N-th band current. The gate of the transistor $164G_N$ is coupled to the node N34 and the source thereof is coupled to the node N35. The gate of the transistor $164H_N$ receives a bit signal $S_N$, the source thereof is coupled to the drain of the PMOS transistor $164G_N$, and the drain there of is coupled to the node N36. In an exemplary embodiment, the ratio of the N-th band current to the L-th band current is $2^{(N-1)}:2^{(L-1)}$, where 1≤M<N.

In the embodiment of FIG. 4, the frequency compensation circuit 16 further comprises a calibrator 165 that receives the reference signal $S_{REF}$. During the initial operation of the PLL circuit 1 for locking the frequency of the output signal output signal $S_{ICO}$, the frequency compensation circuit 16 generates the bit signals $S_1$-$S_N$ according to the reference signal $S_{REF}$, and at least one of the PMOS transistors $164H_1$-$164H_N$ is turned on according to the bit signals $S_1$-$S_N$ to select at least one band current. After the initial operation, the control current $I_{BAND}$ is generated through the selected band current(s). In the embodiment of FIG. 4, the control current $I_{BAND}$ may be a multiple of the bias current $I_B$ based on the selected band current(s). Specifically, the control current $I_{BAND}$ may be M times the bias current $I_B$, wherein 1≤M≤$2^N$-1.

Figure 5:
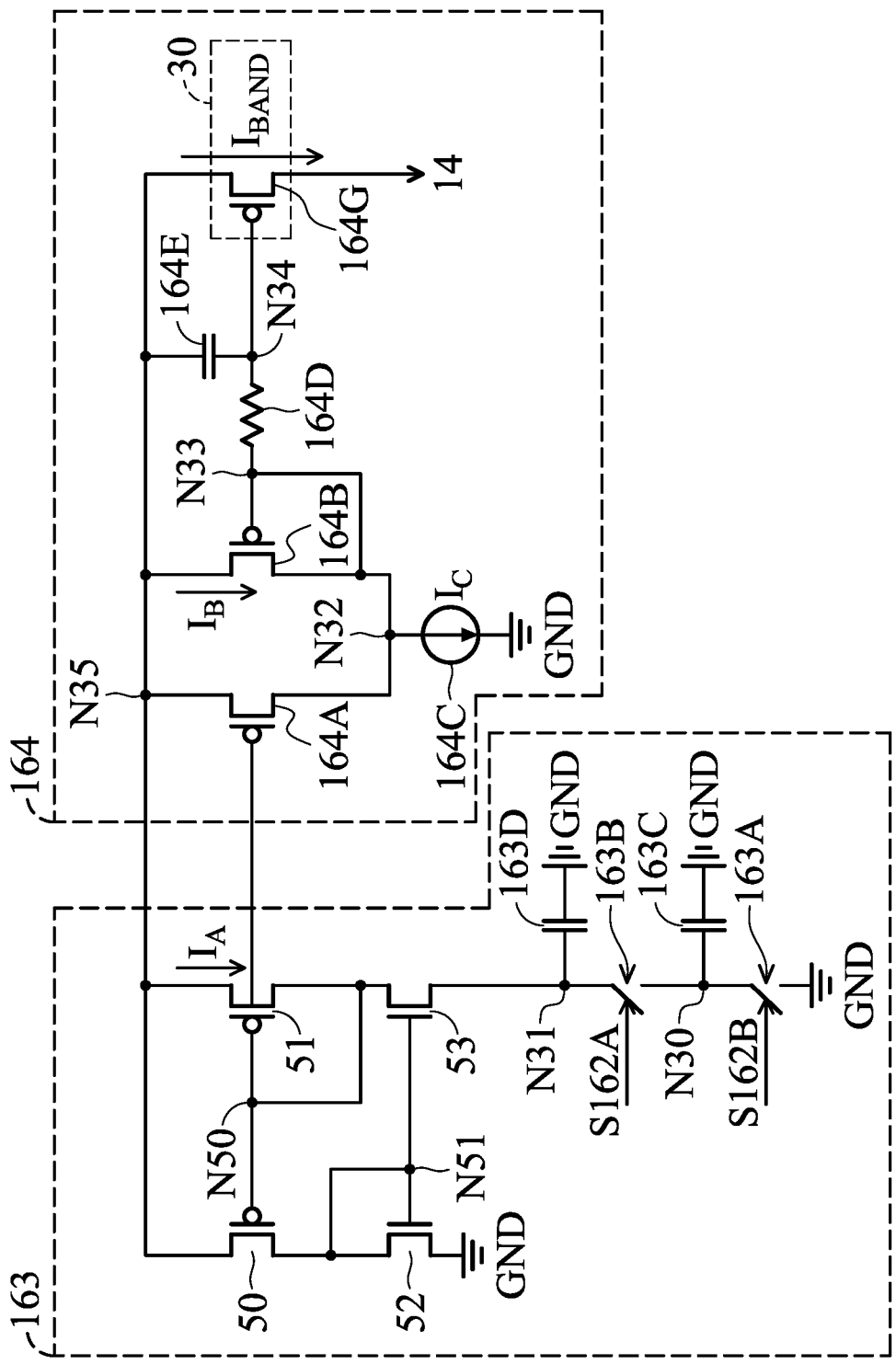
FIG. 5 shows another exemplary embodiment of a frequency-to-current conversion circuit and a current bias circuit of the PPL circuit shown in FIG. 1.
Figure 6:
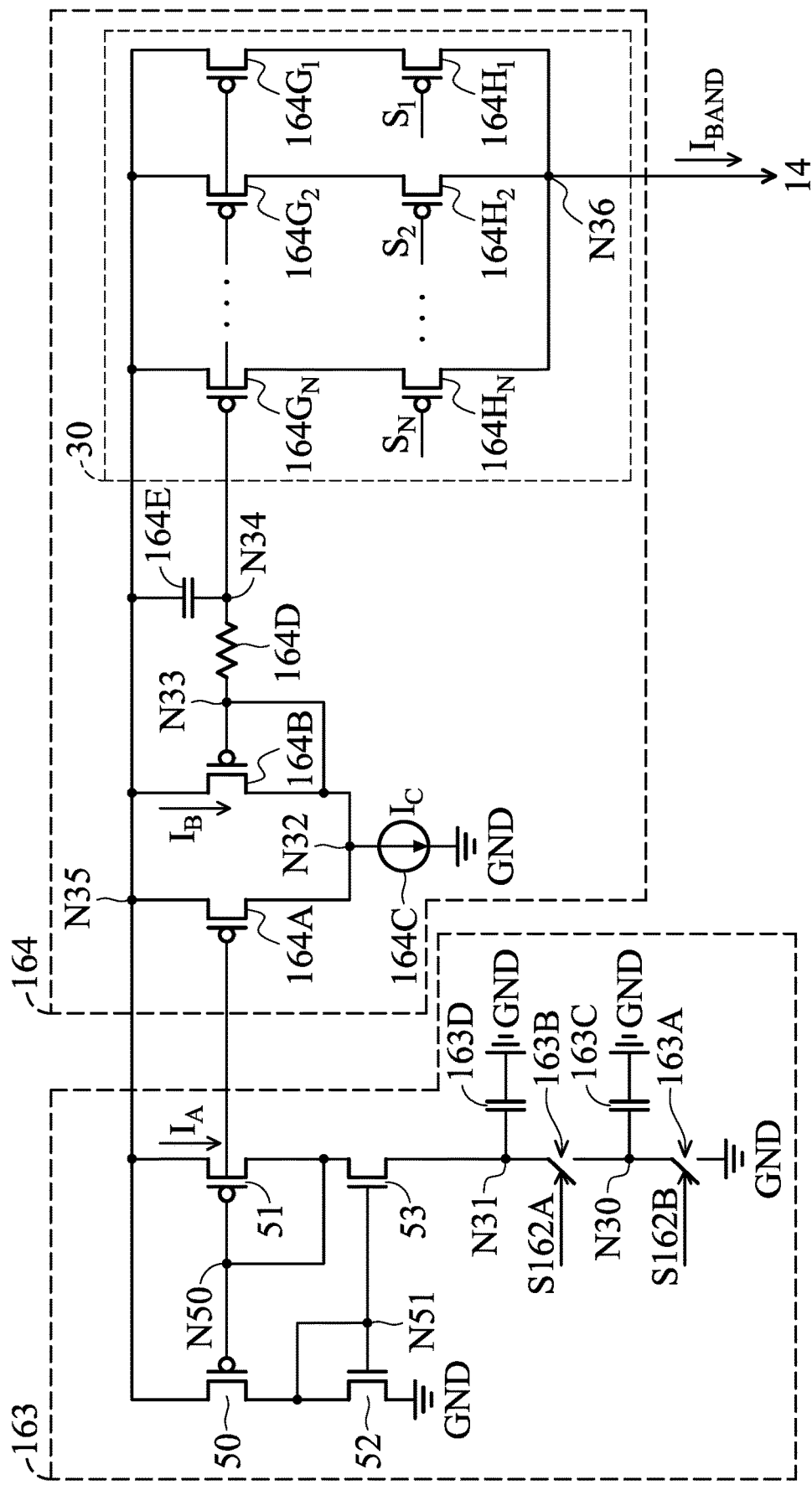
FIG. 6 shows another exemplary embodiment of a frequency-to-current conversion circuit and a current bias circuit of the PPL circuit shown in FIG. 1.

In other embodiments, the F-to-I conversion circuit 163 may comprise a self-bias circuit. As shown in FIGS. 5-6, the F-to-I conversion circuit 163 comprises P-type transistors 50 and 51 and N-type transistors 52 and 53 for replacing the operational amplifier 163E and the PMOS transistor 163F shown in FIGS. 3-4, wherein the P-type transistors 50 and 51 and N-type transistors 52 and 53 may form a self-bias circuit. In the embodiment, the P-type transistors 50 and 51 are implemented by PMOS transistors, and the N-type transistors 52 and 53 are implemented by a N-type metal-oxide-semiconductor (NMOS) transistors. The gate of the PMOS transistor 50 is coupled to a node N50, the source there of is coupled to the node N35, and the drain thereof is coupled to a node N51. The gate and drain of the NMOS transistor 52 are coupled to the node N51, and the source there of is coupled to the ground GND. The gate and drain of the PMOS transistor 51 are coupled to the node N50, and the source there of is coupled to the node N35. The gate of the NMOS transistor 53 is coupled to the node N51, the drain thereof is coupled to the node N50, and the source thereof is coupled to the node N31. The bias current $I_A$ flows through the PMOS transistor 51 and the NMOS transistor 53. In the embodiment of FIG. 5, the gate of the PMOS transistor 164A is coupled to the node N50 (that is, the gate of the PMOS transistor 50 and 51).

Figure 7:
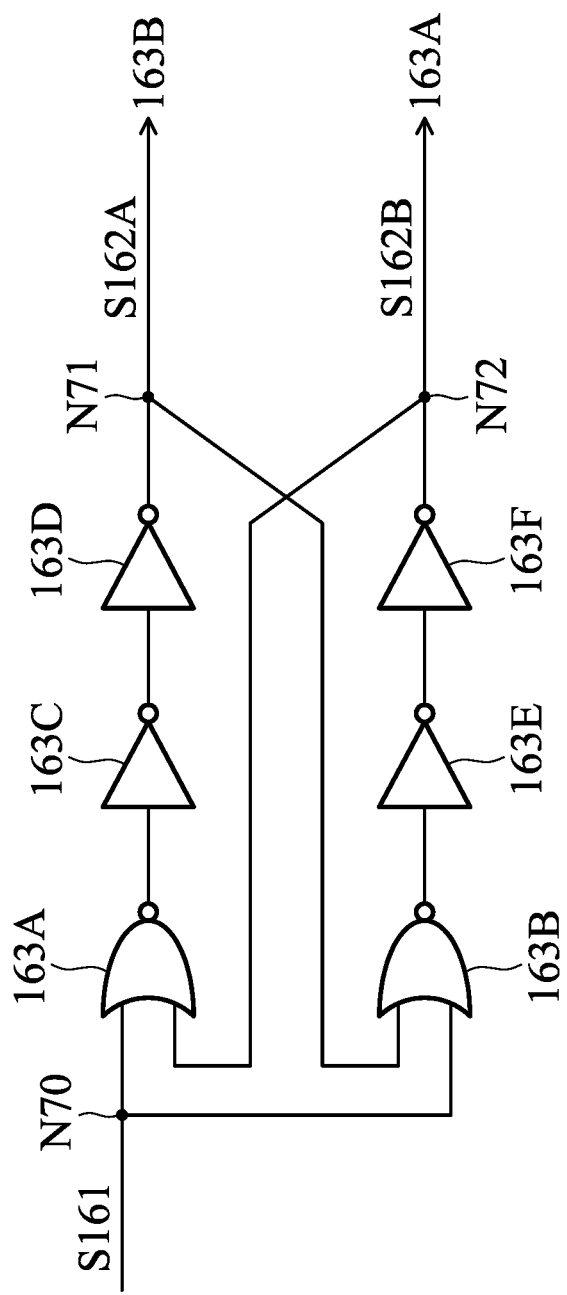
FIG. 7 shows an exemplary embodiment of a phase generation circuit.

FIG. 7 shows an exemplary embodiment of the phase generation circuit 162. Referring to FIG. 7, the phase generation circuit 162 comprises NOR gates 163A-163B and inverters 163C-163F. One input terminal of the NOR gate 163A is coupled to a node N70 to receive the control signal S161, and the other terminal thereof is coupled to a node N72. An input terminal of the inverter 163C is coupled to the output terminal of the NOR gate 163A. An input terminal of the inverter 163D is coupled to an output terminal of the inverter 163C, and an output terminal thereof is coupled to a node N71. One input terminal of the NOR gate 163B is coupled to the node N70 to receive the control signal S161, and the other terminal thereof is coupled to the node N71. An input terminal of the inverter 163E is coupled to the output terminal of the NOR gate 163B. An input terminal of the inverter 163F is coupled to an output terminal of the inverter 163E, and an output terminal thereof is coupled to the node N72. The switching signal S162 is generated at the node N71 (the output terminal of the inverter 163D), and the switching signal S162B is generated at the node N72 (the output terminal of the inverter 163F).

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-locked loop (PLL) circuit generating an output signal with an output frequency, comprising:
    a voltage-to-current conversion circuit configured to generate a first control current according to a control voltage, wherein the control voltage is generated according to a reference signal and a feedback signal derived from the output signal;
    a frequency compensation circuit configured to generate a second control current according to the control voltage; and
    a current-controlled oscillator (ICO) configured to generate the output signal according to an oscillation current, wherein the oscillation current is a sum of the first control current and the second control current,
    wherein in response to the frequency compensation circuit detecting that the control voltage is out of a predetermined range, the second control current is controlled to be negatively correlated with the output frequency;
    wherein the frequency compensation circuit comprises:
    a voltage monitor configured to generate a selection signal for indicating whether the control voltage is out of the predetermined range;
    a frequency selector configured to select one of the reference signal and the feedback signal according to the selection signal to serve as a control signal;
    a phase generation circuit configured to generate a first switching signal and a second switching signal according to the control signal, wherein the first and second switching signals have the same switching frequency;
    a frequency-to-current conversion circuit configured to receive the first and second switching signals and generate a first bias current according to the switching frequency, wherein the first bias current is positively correlated with the switching frequency; and
    a current bias circuit coupled to the frequency-to-current conversion circuit and configured to generate the second control current according to the first bias current, wherein the second control current is negatively correlated with the first bias current.

2. The PLL circuit as claimed in claim 1, wherein:
    in response to the frequency compensation circuit detecting that the control voltage is higher than the predetermined range, the frequency compensation circuit decreases the second control current, and
    in response to the frequency compensation circuit detecting that the control voltage is lower than the predetermined range, the frequency compensation circuit increases the second control current.

3. The PLL circuit as claimed in claim 1, wherein:
    in response to the voltage monitor detecting that the control voltage is higher than the predetermined range, the frequency selector selects the feedback signal according to the selection signal to serve as the control signal, the frequency-to-current conversion circuit increases the first bias current according to the switching frequency corresponding to the feedback signal, and the current bias circuit decreases the second control current, and
    in response to the voltage monitor detecting that the control voltage is lower than the predetermined range, the frequency selector selects the feedback signal according to the selection signal to serve as the control signal, the frequency-to-current conversion circuit decreases the first bias current according to the switching frequency corresponding to the feedback signal, and the current bias circuit increases the second control current.

4. The PLL circuit as claimed in claim 1, wherein the voltage monitor comprises:
    a first comparator having a positive input terminal receiving the control voltage and a negative input terminal receiving a first voltage threshold and configured to generate a first comparison signal;
    a second comparator having a positive input terminal receiving a second voltage threshold and a negative input terminal receiving the control voltage and configured to generate a second comparison signal, wherein the second voltage threshold is greater than the first voltage threshold, and the predetermined range is defined by the first voltage threshold and the second voltage threshold; and
    a NAND gate configured to receive the first comparison signal and the second comparison signal and generate the selection signal.

5. The PLL circuit as claimed in claim 4, wherein the first and second comparators are hysteresis comparators.

6. The PLL circuit as claimed in claim 1, wherein the frequency selector comprises:
    a multiplexer having a first input terminal for receiving the reference signal, a second input terminal for receiving the feedback signal, and an output terminal for outputting the control signal,
    wherein in response to the selection signal being asserted, the multiplexer transmits the feedback signal to the output terminal of the multiplexer to serve as the control signal, and
    wherein in response to the selection signal being deasserted, the multiplexer transmits the reference signal to the output terminal of the multiplexer to serve as the control signal.

7. The PLL circuit as claimed in claim 1, wherein the switching frequency of the first and second switching signals is equal to a frequency of the control signal, and the first and the second switching signals are phase-inverted.

8. The PLL circuit as claimed in claim 1, wherein the frequency-to-current conversion circuit comprises:

a first switch coupled between a second node and a ground and controlled by the second switching signal;
a first capacitor coupled between the second node and the ground;
a second switch coupled between a third node and the second node and controlled by the first switching signal;
a P-type transistor having a gate, a source coupled to a fourth node, and a drain coupled to the third node; and
an operational amplifier having a positive input terminal coupled to the third node, a negative input terminal for receiving a reference voltage, and an output terminal coupled to the gate of the P-type transistor,
wherein the first bias current flows through the first P-type transistor.

9. The PLL circuit as claimed in claim 8, wherein the frequency-to-current conversion circuit further comprises:
a second capacitor coupled between the third node and the ground,
wherein a capacitive value of the second capacitor is greater than a capacitive value of the first capacitor.

10. The PLL circuit as claimed in claim 8, wherein the current bias circuit comprises:
a second P-type transistor having a gate coupled to the output terminal of the operational amplifier, a source coupled to the fourth node, a drain coupled to a fifth node;
a current source coupled between the fifth node and the ground and configured to provide a predetermined current;
a third P-type transistor having a gate coupled to a sixth node, a source coupled to the fourth node, a drain coupled to the fifth node; and
a current generation circuit coupled to the fourth node and the ICO,
wherein a second bias current flows through the third P-type transistor, and the current generation circuit is configured to generate the second control current according to the second bias current.

11. The PLL circuit as claimed in claim 10, wherein the second control current is a multiple of the second bias current.

12. The PLL circuit as claimed in claim 10, wherein the current generation circuit comprises:
a fourth P-type transistor having a gate coupled to the sixth node, a source coupled to the fourth node, and a drain coupled to the ICO,
wherein the second control current flows the fourth P-type transistor.

13. The PLL circuit as claimed in claim 10, wherein the current generation circuit comprises:
a fourth P-type transistor having a gate coupled to the sixth node, a source coupled to the fourth node, and a drain;
a fifth P-type transistor having a gate for receiving a first bit signal, a source coupled to the drain of the fourth P-type transistor, and a drain coupled to a seventh node;
a sixth P-type transistor having a gate coupled to the sixth node, a source coupled to the fourth node, and a drain; and
a seventh P-type transistor having a gate for receiving a second bit signal, a source coupled to the drain of the sixth P-type transistor, and a drain coupled to the seventh node,
wherein at least one of the fifth and seventh P-type transistor is turned on, and the second control current flows from the seventh node to the ICO.

14. The PLL circuit as claimed in claim 10, wherein the current bias circuit further comprises:
a resistor coupled between the sixth node and the current generation circuit; and
a third capacitor coupled between the fourth node and the current generation circuit.

15. The PLL circuit as claimed in claim 1, wherein the frequency-to-current conversion circuit comprises:
a first switch coupled between a second node and a ground and controlled by the second switching signal;
a first capacitor coupled between the second node and the ground;
a second switch coupled between a third node and the second node and controlled by the first switching signal;
a first P-type transistor having a gate coupled to a fifth node, a source coupled to a fourth node, and a drain;
a first N-type transistor having a gate and a drain both coupled to the drain of the P-type transistor at a sixth node and further having a source coupled to the ground;
a second P-type transistor having a gate coupled to the fifth node, a source coupled to the fourth node, and a drain coupled to the fifth node; and
a second N-type transistor having a gate coupled to the sixth node, a drain coupled to the fifth node, and a source coupled to the third node,
wherein the first bias current flows through the second P-type transistor and the second N-type transistor.

16. The PLL circuit as claimed in claim 15, wherein the frequency-to-current conversion circuit further comprises:
a second capacitor coupled between the third node and the ground;
wherein a capacitive value of the second capacitor is greater than a capacitive value of the first capacitor.

17. The PLL circuit as claimed in claim 15, wherein the current bias circuit comprises:
a third P-type transistor having a gate coupled to the fifth node, a source coupled to the fourth node, a drain coupled to a seventh node;
a current source coupled between the seventh node and the ground and configured to provide a predetermined current;
a fourth P-type transistor having a gate coupled to an eighth node, a source coupled to the fourth node, a drain coupled to the seventh node; and
a current generation circuit coupled to the fourth node and the ICO,
wherein a second bias current flows through the fourth P-type transistor, and the current generation circuit is configured to generate the second control current according to the second bias current.

18. The PLL circuit as claimed in claim 17, wherein the current bias circuit further comprises:
a resistor coupled between the eighth node and the current generation circuit; and
a third capacitor coupled between the fourth node and current generation circuit.

19. The PLL circuit as claimed in claim 17, wherein the current generation circuit comprises:
a fifth P-type transistor having a gate coupled to the eighth node, a source coupled to the fourth node, and a drain;
a sixth P-type transistor having a gate for receiving a first bit signal, a source coupled to the drain of the fifth P-type transistor, and a drain coupled to a ninth node;
a seventh P-type transistor having a gate coupled to the eighth node, a source coupled to the fourth node, and a drain; and an eighth P-type transistor having a gate for receiving a second bit signal, a source coupled to the drain of the seventh P-type transistor, and a drain coupled to the ninth node, wherein at least one of the six and eighth P-type transistor is turned on, and the second control current flows from the seventh node to the ICO.

* * * * *